(12) United States Patent
Kadirvel et al.

(10) Patent No.: US 8,305,039 B2
(45) Date of Patent: Nov. 6, 2012

(54) ELECTRICAL ENERGY STORAGE SYSTEMS AND METHODS

(75) Inventors: Karthik Kadirvel, Melbourne, FL (US); John H. Carpenter, Jr., Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 326 days.

(21) Appl. No.: 12/836,897

(22) Filed: Jul. 15, 2010

(65) Prior Publication Data
US 2012/0013306 A1    Jan. 19, 2012

(51) Int. Cl.
*H02J 7/00* (2006.01)
(52) U.S. Cl. .................................. 320/132; 320/134
(58) Field of Classification Search .............. 320/132, 320/134
See application file for complete search history.

(56) References Cited

U.S. PATENT DOCUMENTS

| | | | | |
|---|---|---|---|---|
| 5,883,496 A | * | 3/1999 | Esaki et al. | 320/132 |
| 7,898,844 B2 | * | 3/2011 | Wang et al. | 365/158 |

* cited by examiner

*Primary Examiner* — M'baye Diao
(74) *Attorney, Agent, or Firm* — William B. Kempler; Wade J. Brady, III; Frederick J. Telecky, Jr.

(57) ABSTRACT

Systems and methods for determining a state of charge (SOC) of an electrical energy storage device are disclosed. In one embodiment, a system is provided for determining the SOC of an electrical energy storage device comprises at least one memristor coupled in series with the electrical energy storage device to monitor charge current and discharge current of the electrical energy storage device. The system also includes a readout controller configured to determine the SOC of the electrical energy storage device based on the resistance of the memristor.

20 Claims, 3 Drawing Sheets

ELECTRICAL ENERGY STORAGE SYSTEMS AND METHODS

TECHNICAL FIELD

This invention relates to electronics, and more specifically, to electrical energy storage systems and methods.

BACKGROUND

In a rechargeable battery pack or other electrical energy storage devices, it is necessary to know the amount of charge left to determine the electrical energy lifetime. Current solutions solve this problem by doing precise measurements of the voltage across the electrical energy storage device, the charging and discharge current from the electrical energy storage device, the ambient temperature, the electrical energy storage device chemistry and then use an algorithm to predict the state of charge (SOC) of the electrical energy storage device. The current solutions consume substantial amounts of power due to the utilization of analog-to-digital converters (ADCs), clocks and other circuitry. Ideally the voltage and current should be monitored continuously. However, current systems sample the voltage and current by taken a series of repeated samples to mitigate samples that include current surges.

SUMMARY

In an aspect of the invention, a system is provided for determining a state of charge (SOC) of an electrical energy storage device. The system comprises at least one memristor coupled in series with the electrical energy storage device to monitor charge current and discharge current of the electrical energy storage device and a readout controller configured to determine the SOC of the electrical energy storage device based on the resistance of the memristor.

In another aspect of the invention, a system is provided for charging an electrical energy storage device. The system comprises a parallel bank of memristors coupled in series with the electrical energy storage device, where the bank of memristors increase in resistance with one of charging and discharging of the electrical energy storage device and decrease in resistance with the other of charging and discharging of the electrical energy storage device. The system also comprises a charger coupled to the electrical energy storage device for charging the electrical energy storage device, a load coupled to the electrical energy storage device that causes the electrical energy storage device to discharge and a readout controller configured to determine the SOC of the electrical energy storage device based on a resistance measurement of at least one memristor of the parellel bank of memristors. The readout controller is further configured to instruct the charger to charge the electrical energy storage device if the SOC of the electrical energy storage device falls between a predetermined threshold and to allow the continued discharging of the electrical energy storage device to the load if the state of charge of the electrical energy storage device is at or above the predetermined threshold.

In yet another aspect of the invention, a method for charging an electrical energy storage device is provided. The method comprises measuring a resistance of at least one memristor coupled in series with the electrical energy storage device, determining a SOC of the electrical energy storage device based on the measured resistance and charging the electrical energy storage device for a predetermined time period if the SOC of the electrical energy storage device is below a predetermined threshold.

DETAILED DESCRIPTION

The present invention relates to electrical energy storage device charging systems and methods that employ one or more memristors to determine a state of charge (SOC) of a electrical energy storage device. A memristor is a device that displays the property of memristance. Memristance is a property of an electronic component, such that if charge flows in one direction through the component, the resistance of that component will increase, and if charge flows in the opposite direction in the component, the resistance will decrease. If the flow of charge is stopped by turning off the applied voltage, the component will 'remember' the last resistance state and when the flow of charge starts again the resistance of the component will be what it was when it was last active. In aspects of the present invention, a memristor is used for determining the SOC of a electrical energy storage device and the SOC is employed to determine when to charge the electrical energy storage device and thus when to allow the electrical energy storage device to provide a load current to a load. The instantaneous memristance value is a measure of the net charge of current that has flowed through the memristor.

Figure 1:
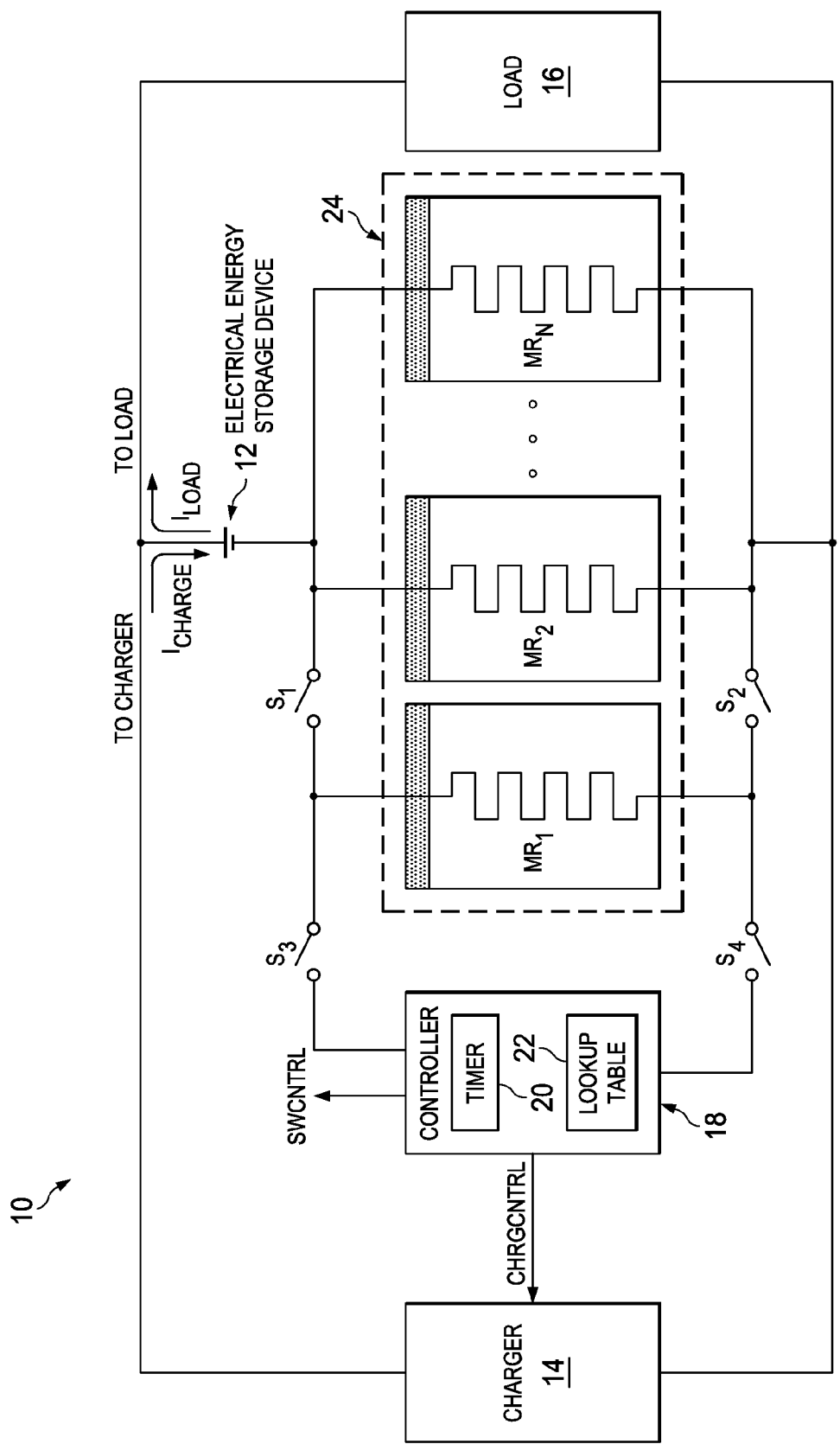
FIG. 1 illustrates a system for charging an electrical energy storage device in accordance with an aspect of the invention.

FIG. 1 illustrates a representative schematic of a system 10 for charging a electrical energy storage device 12 in accordance with an aspect of the present invention. The electrical energy storage device 12 can be one or more rechargeable batteries, primary batteries, supercapacitors or fuel cells in addition to other rechargeable electrical energy storage devices. The system 10 could be implemented, for example, in a laptop computer, a mobile phone, a personal digital assistant (PDA) or the like. The electrical energy storage device 12 could be implemented as one or more rechargeable batteries, such as one or more lithium ion batteries (Li-ion), a lithium ion polymer (Li-ion polymer), nickel-metal hydride batteries (NiMH), nickel-cadmium batteries (Ni-Cad), etc. The system 10 can include a readout controller 18 that can be implemented, as hardware, software or a combination thereof. The readout controller 18 is configured to read the resistance of at least one memristor coupled in series with the electrical energy storage device 12. The readout controller 18 is further configured to instruct (CHGCNTRL) a charger 14 when to charge the electrical energy storage device 12 and configured to control (SWCNTRL) switches of the system 10 between open and closed positions. Moreover, although FIG. 1 illustrates the readout controller 18 as providing the functions of measuring and controlling the charger 14 and switches, there could be separate devices for each of the resistance measuring, the charge control and switch control functions.

The system 10 is configured to determine a SOC of the electrical energy storage device 12 utilizing memristors. A parallel bank of memristors 24, labeled $MR_1$-$MR_N$, where N is an integer greater than one, is connected in series with terminals of the rechargeable electrical energy storage device 12. The system 10 is configurable in three different states. In a first state, the electrical energy storage device 12 is connected to a load 16 and is discharging current to the load 16. In the first state, the discharge current $I_{LOAD}$ flows in one direction through the bank of memristors 24 and causes the memristance to increase in resistance value. During this mode, switches $S_1$ and $S_2$ are closed and switches $S_3$ and S4 are open. Multiple memristors are used to reduce the current through each memristor and hence limit the power dissipation across each memristor. In a second state, the electrical energy storage device 12 is connected to and being charged by the charger 14. When the electrical energy storage device 12 is being charged from the charger 14, the memristance in each memristor in the bank of memristors 24 decreases as the charge current $I_{CHARGE}$ is flowing in the opposite direction. During this mode, switches $S_1$ and $S_2$ are closed and switches $S_3$ and S4 are open.

A third state is a charge measurement cycle or period. During the third state, switches $S_1$ and $S_2$ are open and $S_3$ and S4 are closed. In the third state, one of the memristors ($MR_1$) of the bank of memristors 24 is disconnected from the electrical energy storage device path and the readout controller 18 is connected across the one of the memristors ($MR_1$). A sinusoidal test AC current waveform is applied across the memristance and the voltage is measured using an accurate A/D converter (not shown). It should be noted that the AC waveform will not alter the memristance value if integer number of cycles are used as the net current flow over integer number of cycles is substantially zero. Using the voltage measurement and the value of the input current, the instantaneous value of the memristance is obtained which provides a measurement of the SOC, for example, via a lookup table 22. The readout controller 20 can also include a timer 20 that provides an indication of when to do a measurement cycle or period, such as after providing the load current $I_{LOAD}$ to the load 16 for a predetermined period of time and/or providing a charge current $I_{CHARGE}$ to the electrical energy storage device 12 for a predetermined period of time prior to performing the measurement cycle or period or the time period between a measurement cycle or period.

If the electrical energy storage device's 12 SOC at a given time instance is determined, the readout controller 18 can determine the time remaining (hereinafter, "remaining electrical energy storage device run time") before the electrical energy storage device 12 ceases to provide an adequate current to power a system (not shown). The remaining electrical energy storage device run time can depend, for example, on the SOC of the electrical energy storage device 12, the output current of the electrical energy storage device 12, the temperature of the electrical energy storage device 12, the age of the electrical energy storage device 12, etc. The SOC data can include, for example, information (e.g., algorithms, look-up tables, etc.) that can be employed by the readout controller 18 to determine the remaining electrical energy storage device run time for a given SOC of the electrical energy storage device 12. The SOC can be represented, for example, as a percentage (e.g., 0%-100%) of a fully charged state of the electrical energy storage device 12.

Figure 2:
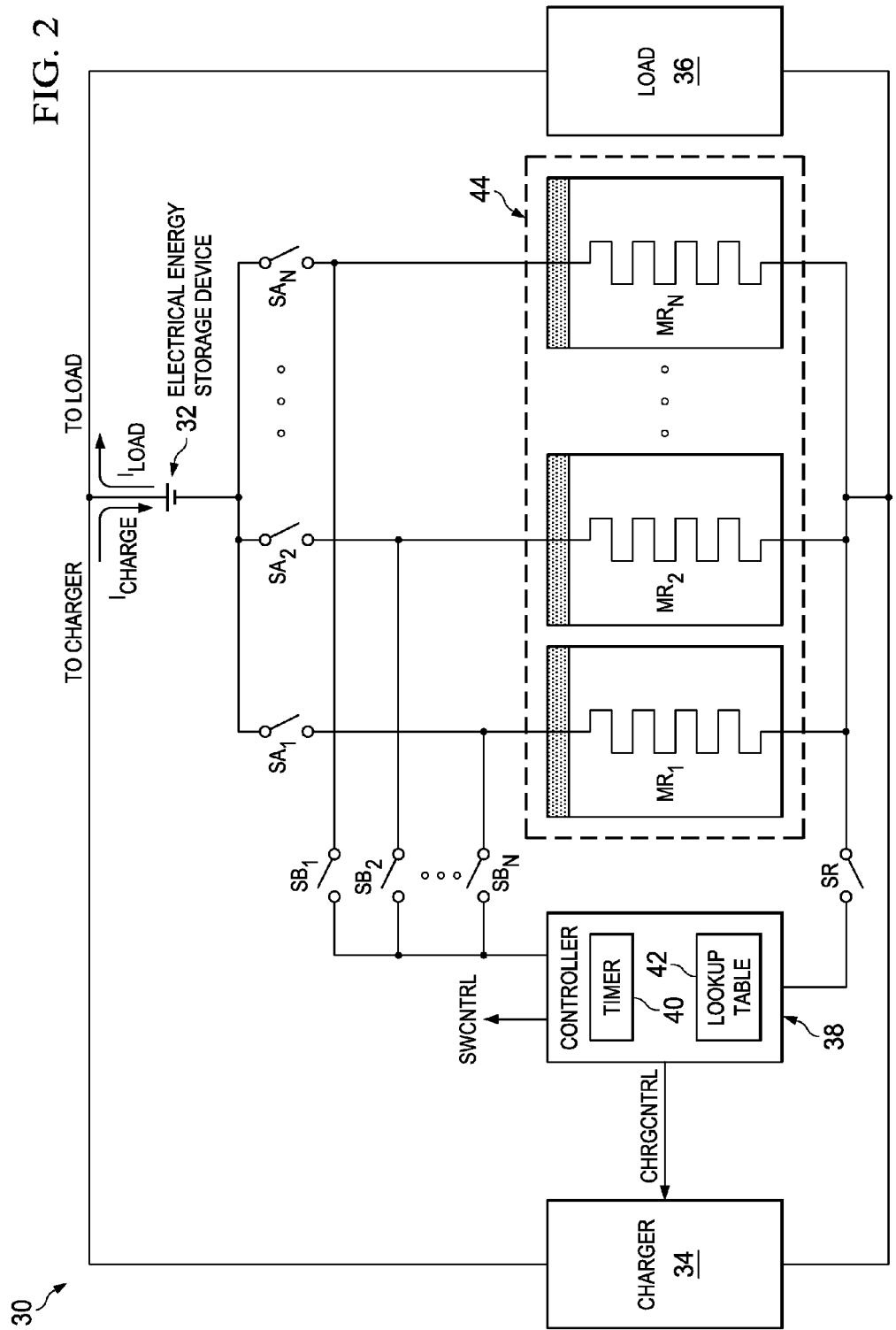
FIG. 2 illustrates another system for charging an electrical energy storage device in accordance with an aspect of the invention.

FIG. 2 illustrates a representative schematic of another system 30 for charging a electrical energy storage device 32 in accordance with an aspect of the present invention. It is to be appreciated that although the measurement error due to the measurement cycle is very small compared to a conventional sampling system, a further averaging and reduction of the error can be accomplished by sequentially and repeatedly switching between the measurement of different memristors for each different measurement cycle or period. The system 30 includes a readout controller 38 that controls a set or bank of electrical energy storage device current switches $SA_1$ and $SA_N$ and a set or bank of resistance measurement switches $SB_1$ and $SB_N$ and reference switch SR, where N is an integer greater than 1. The electrical energy storage device current switches $SA_1$ and $SA_N$, the resistance measurement switches $SB_1$ and $SB_N$ and the reference switch SR allow for the system 30 to switch between the measuring of different memristors for each different measurement cycle or period.

Again, although FIG. 2 illustrates the readout controller 38 as providing the function of measuring and controlling the charger (CHGCNTRL) and switches (SWCNTRL), there could be separate devices for each of the measuring, the charge control and switch control functions. Additionally, the readout controller 38 can be configured to provide protection to the battery and/or other parts of the system upon the SOC of the battery exceeding a predetermined threshold and/or falling below a predetermined threshold by opening current switches $SA_1$ and $SA_N$, resistance measurement switches $SB_1$ and $SB_N$ and/or reference switch SR.

A parallel bank of memristors 44, labeled $MR_1$-$MR_N$, where N is an integer greater than one, is connected in series with terminals of the rechargeable electrical energy storage device 32. The readout controller 38 can be selectively connected across one of the memristors ($MR_1$) using one of the resistance measurement switches $SB_1$ to $SB_N$ and the reference switch SR. The system 30 is also configurable in three different states. In a first state, the electrical energy storage device 32 is connected to a load 36 and is discharging current to the load 36. In the first state, the discharge current $I_{LOAD}$ flows in one direction through the bank of memristors 44 and causes the memristance to increase in resistance value. During this mode, switches $SA_1$ to $SA_N$ are closed and switches $SB_1$ to $SB_N$ and reference switch SR are open. In a second state, the electrical energy storage device 32 is connected to and being charged by the charger 34. When the electrical energy storage device 32 is being charged from the charger 34, the memristance in each memristor in the bank of memristors 44 decreases as the charge current $I_{CHARGE}$ is flowing in the opposite direction. During this mode, switches $SA_1$ to $SA_N$ are closed and switches $SB_1$ to $SB_N$ and reference switch SR are open.

A third state is a charge measurement cycle in which switches $SA_1$ to $SA_N$ are open and SR is closed and one of the resistance switches $SB_1$ through $SB_N$ is closed. In the third state, one of the memristors of the parallel bank of memristors 44 is disconnected from the electrical energy storage device path and connected to the readout controller 38. The system is configured to sequentially and repeatedly switch between the closing and opening of resistance switches $SB_1$ through $SB_N$ to measure the resistance of a different memristor for each of the memristors in the parallel bank of memristors 44 for different resistance measurement cycles or periods. Upon reading the last memristor of the parallel bank of memristors, the first memristor will be read on the next measurement cycle or period and thus the sequential switching will continue. The readout controller 38 is connected across the selected one of the memristor devices to measure the resistance of the selected memristor. Using the voltage measurement and the value of the input current, the instantaneous value of the memristance is obtained which provides a measurement of the SOC, for example, via a lookup table 42. The readout controller 38 can also include a timer 40 that provides an indication of when to do a measurement cycle, such as after providing the discharge current $I_{LOAD}$ to the load 36 for a predetermined period of time and/or providing a charge current $I_{CHARGE}$ to the electrical energy storage device 32 for a predetermined period of time prior to performing the measurement cycle or period or a time period between measurement cycles or periods.

Figure 3:
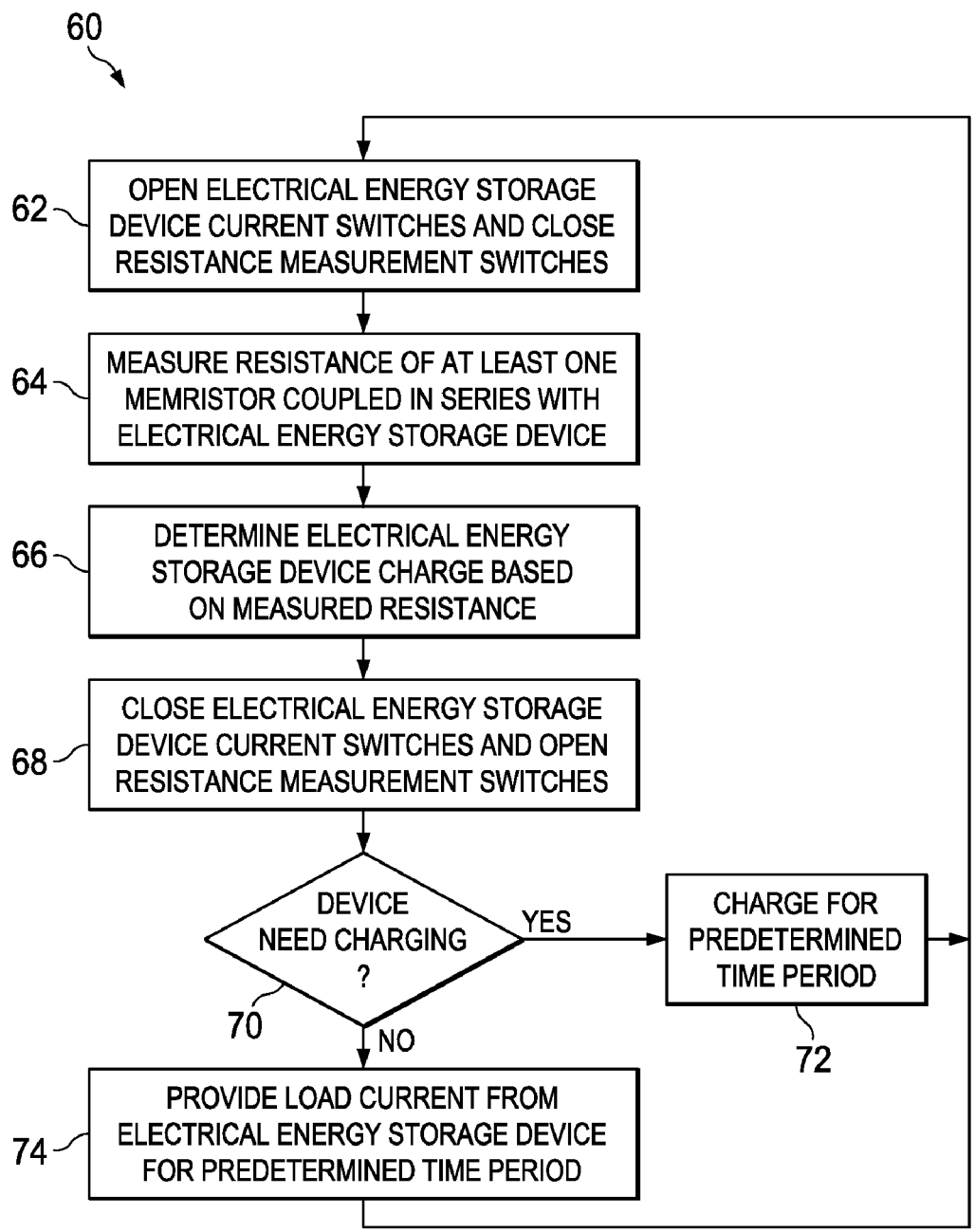
FIG. 3 illustrates a methodology for charging an electrical energy storage device in accordance with an aspect of the invention.

In view of the foregoing structural and functional features described above, a methodology will be better appreciated with reference to FIG. 3. It is to be understood and appreciated that the illustrated actions, in other embodiments, may occur in different orders and/or concurrently with other actions. Moreover, not all illustrated features may be required to implement a method.

FIG. 3 illustrates a methodology 60 for charging an electrical energy storage device in accordance with an aspect of the present invention. At 62, electrical energy storage device current switches are opened and resistance measurement switches are closed. At 64, resistance is measured of at least one memristor coupled in series with a rechargeable electrical energy storage device. The at least one memristor can be part of a parallel bank of memristors and the measurement can be sequentially repeated for different resistance measurement periods by measuring the resistance of a different memristor in the parallel bank or the same memristor can be measured for different resistance measurement periods. At 66, electrical energy storage device SOC is determined based on the measured resistance. At 68, electrical energy storage device current switches are closed and resistance measurement switches are opened. The methodology then proceeds to 70.

At 70, a determination of whether the electrical energy storage device needs charging is made. The determination can be made by comparing the SOC of the electrical energy storage device to a predetermined threshold and determining that the electrical energy storage device needs charging if it is below the predetermined threshold. If it is determined that the electrical energy storage device needs charging (YES), the methodology proceeds to 72 to charge the electrical energy storage device for a predetermined time period. The methodology then repeats 62-70 to repeat the measuring of the resistance of the at least one memristor and the determination of whether or not the electrical energy storage device needs charging based on the measured resistance. If it is determined that the electrical energy storage device does not need charging (NO) at 70, the methodology proceeds to 74 to provide load current from the electrical energy storage device for a predetermined time period. The methodology then repeats 62-70 to repeat the measuring of the resistance of the at least one memristor and the determination of whether or not the electrical energy storage device needs charging based on the measured resistance.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system for determining a state of charge (SOC) of an electrical energy storage device comprising:
    at least one memristor coupled in series with the electrical energy storage device to monitor charge current and discharge current of the electrical energy storage device; and
    a readout controller configured to determine the SOC of the electrical energy storage device based on the resistance of the memristor.

2. The system of claim 1, wherein the at least one memristor comprises a parallel bank of memristors coupled in series with the electrical energy storage device.

3. The system of claim 2, further comprising a plurality of resistance measurement switches configurable to connect the at least one memristor of the parall bank of memristors to the readout controller during measuring of the resistance of the at least one memristor and configurable to disconnect the at least one memristor of the bank of memristors from the readout controller during discharging and charging of the electrical energy storage device.

4. The system of claim 3, further comprising a plurality of electrical energy storage device current switches configurable to disconnect the at least one memristor of the parallel bank of memristors from the electrical energy storage device during measuring of the resistance of the at least one memristor and configurable to connect the at least one memristor of the parallel bank of memristors to the electrical energy storage device during discharging and charging of the electrical energy storage device.

5. The system of claim 3, wherein the plurality of resistance measurement switches are configured to sequentially and repeatedly connect and disconnect a different memristor for measuring for each of the memristors in the bank of memristors for each different resistance measurement period.

6. The system of claim 1, further comprising a charger coupled to the electrical energy storage device for providing charge current to the electrical energy storage device and a load coupled to the electrical energy storage device that causes the electrical energy storage device to provide discharge current to the load.

7. The system of claim 1, further comprising a timer that provides a time period for at least one of charging the electrical energy storage device, allow the discharging of the electrical energy storage device and determining a time between resistance measurement periods.

8. The system of claim 7, further comprising a lookup table that provides a electrical energy storage device SOC based on a resistance value measured of the at least one memristor.

9. A system for charging an electrical energy storage device comprising:
    a parallel bank of memristors coupled in series with the electrical energy storage device, the parallel bank of memristors increase in resistance with one of charging and discharging of the electrical energy storage device and decrease in resistance with the other of charging and discharging of the electrical energy storage device;
    a charger coupled to the electrical energy storage device for charging the electrical energy storage device;
    a load coupled to the electrical energy storage device that causes the electrical energy storage device to discharge; and
    a readout controller configured to determine a state of charge (SOC) of the electrical energy storage device based on a resistance measurement of at least one memristor of the parallel bank of memristors and configured to instruct the charger to charge the electrical energy storage device if the state of charge of the electrical energy storage device falls below a predetermined threshold and to allow the continued discharging of the electrical energy storage device to the load if the state of charge of the electrical energy storage device is at or above the predetermined threshold.

10. The system of claim 9, further comprising a plurality of resistance measurement switches configurable to connect the at least one memristor of the parallel bank of memristors to the readout controller during measuring of the resistance of the at least one memristor and configurable to disconnect the at least one memristor of the parallel bank of memristors from the readout controller during discharging and charging of the electrical energy storage device.

11. The system of claim 10, further comprising a plurality of electrical energy storage device current switches configurable to disconnect the at least one memristor of the parallel bank of memristors from the electrical energy storage device during measuring of the resistance of the at least one memristor and configurable to connect the at least one memristor of the parallel bank of memristors to the electrical energy storage device during discharging and charging of the electrical energy storage device.

12. The system of claim 10, wherein the plurality of resistance measurement switches are configurable to sequentially and repeatedly connect and disconnect a different memristor for measuring for each of the memristors in the parallel bank of memristors for each different resistance measurement period.

13. The system of claim 9, further comprising a timer that provides a time period for at least one of charging the electrical energy storage device, allowing the discharging of the electrical energy storage device and determining a time between resistance measurement periods.

14. The system of claim 9, further comprising a lookup table that provides an electrical energy storage device SOC based on a resistance value measured of the at least one memristor.

15. A method for charging an electrical energy storage device, the method comprising:
measuring a resistance of at least one memristor coupled in series with the electrical energy storage device;
determining a state of charge (SOC) of the electrical energy storage device based on the measured resistance; and
charging the electrical energy storage device for a predetermined time period if the SOC of the electrical energy storage device is below a predetermined threshold.

16. The method of claim 15, wherein the at least one memristor comprises a parallel bank of memristors coupled in series with the electrical energy storage device.

17. The method of claim 16, further comprising connecting the at least one memristor of the parallel bank of memristors to a readout controller via a plurality of resistance measurement switches during measuring the resistance of the at least one memristor and disconnecting the at least one memristor of the parallel bank of memristors from the readout controller via the plurality of resistance measurement switches during discharging and charging of the electrical energy storage device.

18. The method of claim 17, further comprising disconnecting the at least one memristor of the parallel bank of memristors from the electrical energy storage device via a plurality of electrical energy storage device current switches during measuring of the resistance of the at least one memristor and connecting the at least one memristor of the bank of memristors to the electrical energy storage device via the plurality of electrical energy storage device current switches during discharging and charging of the electrical energy storage device.

19. The method of claim 17, further comprising sequentially and repeatedly connecting and disconnecting a different memristor for measuring for each of the memristors in the parallel bank of memristors via the plurality of resistance measurement switches for each different resistance measurement period.

20. The method of claim 15, further comprising providing current to a load from the electrical energy storage device for a predetermined time period if the SOC of the electrical energy storage device is at or above the predetermined threshold.

* * * * *